United States Patent
Tinnemans et al.

(10) Patent No.: US 9,488,921 B2
(45) Date of Patent: Nov. 8, 2016

(54) LITHOGRAPHY APPARATUS, AN APPARATUS FOR PROVIDING SETPOINT DATA, A DEVICE MANUFACTURING METHOD, A METHOD OF CALCULATING SETPOINT DATA AND A COMPUTER PROGRAM

(71) Applicant: ASML Netherlands B.V., Veldhoven (NL)

(72) Inventors: Patricius Aloysius Jacobus Tinnemans, Hapert (NL); Wouter Frans Willem Mulckhuyse, Bussum (NL)

(73) Assignee: ASML NETHERLANDS B.V., Veldhoven (NL)

( * ) Notice: Subject to any disclaimer, the term of this patent is extended or adjusted under 35 U.S.C. 154(b) by 220 days.

(21) Appl. No.: 14/356,357

(22) PCT Filed: Nov. 15, 2012

(86) PCT No.: PCT/EP2012/072765
§ 371 (c)(1),
(2) Date: May 5, 2014

(87) PCT Pub. No.: WO2013/083383
PCT Pub. Date: Jun. 13, 2013

(65) Prior Publication Data
US 2014/0285786 A1    Sep. 25, 2014

Related U.S. Application Data

(60) Provisional application No. 61/567,485, filed on Dec. 6, 2011.

(51) Int. Cl.
*G03B 27/32* (2006.01)
*G03B 27/54* (2006.01)
*G03F 7/20* (2006.01)

(52) U.S. Cl.
CPC ....... *G03F 7/70508* (2013.01); *G03F 7/70291* (2013.01); *G03F 7/70391* (2013.01); *G03F 7/70558* (2013.01)

(58) Field of Classification Search
CPC .......... G03F 7/70275; G03F 7/70291; G03F 7/70366; G03F 7/70391; G03F 7/704; G03F 7/70508; G03F 7/70558
USPC ..................................... 355/67, 77
See application file for complete search history.

(56) References Cited

U.S. PATENT DOCUMENTS

| 4,090,206 A | 5/1978 | Pfeifer |
| 4,447,126 A | 5/1984 | Heidrich |

(Continued)

FOREIGN PATENT DOCUMENTS

| DE | 4315581 | 11/1994 |
| DE | 19813127 | 10/1998 |

(Continued)

OTHER PUBLICATIONS

International Preliminary Report on Patentability mailed Jun. 19, 2014 in International Patent Application No. PCT/EP2012/072765.

(Continued)

*Primary Examiner* — Colin Kreutzer
(74) *Attorney, Agent, or Firm* — Pillsbury Winthrop Shaw Pittman LLP (57) ABSTRACT

An exposure apparatus configured to project each of a plurality of radiation beams onto a respective location on a target, the plurality of radiation beams forming a desired dose pattern via a plurality of spot exposures, the nominal position of a characteristic point in the dose distribution of each of the spot exposures lying at points defining a first grid. The apparatus has, or is provided data from, a controller configured to: calculate a target intensity value for each of the plurality of radiation beams to expose the target to the desired dose pattern, the calculation using as input a rasterized representation of the desired dose pattern, the rasterized representation including a dose value defined at each of a plurality of points on a second grid, the first and second grids having the same geometry, and control the exposure apparatus to emit beams with the target intensity values.

20 Claims, 7 Drawing Sheets (56) References Cited

U.S. PATENT DOCUMENTS

| | | | |
|---|---|---|---|
| 4,520,472 | A | 5/1985 | Reno |
| 4,525,729 | A | 6/1985 | Agulnek |
| 4,640,573 | A | 2/1987 | Kataoka |
| 4,780,730 | A | 10/1988 | Dodge |
| 4,796,038 | A | 1/1989 | Allen |
| 4,844,568 | A | 7/1989 | Suzuki |
| 4,864,216 | A | 9/1989 | Kalata |
| 4,952,949 | A | 8/1990 | Uebbing |
| 5,051,762 | A | 9/1991 | Lea |
| 5,216,247 | A | 6/1993 | Wang |
| 5,216,534 | A | 6/1993 | Boardman |
| 5,229,872 | A | 7/1993 | Mumola |
| 5,296,891 | A | 3/1994 | Vogt |
| 5,457,488 | A | 10/1995 | Nakamura |
| 5,481,392 | A | 1/1996 | Damer |
| 5,523,193 | A | 6/1996 | Nelson |
| 5,568,320 | A | 10/1996 | Rees |
| 5,589,973 | A | 12/1996 | King |
| 5,610,754 | A | 3/1997 | Gheen |
| 5,668,587 | A | 9/1997 | Hammond |
| 5,705,788 | A | 1/1998 | Beyer |
| 5,838,024 | A | 11/1998 | Masuda |
| 5,840,451 | A | 11/1998 | Moore |
| 6,037,965 | A | 3/2000 | Gross |
| 6,133,986 | A | 10/2000 | Johnson |
| 6,204,875 | B1 | 3/2001 | De Loor |
| 6,268,613 | B1 | 7/2001 | Cantu |
| 6,310,710 | B1 | 10/2001 | Shahar |
| 6,313,862 | B1 | 11/2001 | Berner |
| 6,466,352 | B1 | 10/2002 | Shahar |
| 6,531,681 | B1 | 3/2003 | Markle |
| 6,559,438 | B1 | 5/2003 | Drobot |
| 6,683,727 | B1 | 1/2004 | Goring |
| 6,765,647 | B1 | 7/2004 | Nishi |
| 6,795,169 | B2 | 9/2004 | Tanaka |
| 6,967,711 | B2 | 11/2005 | Gui |
| 7,116,402 | B2 | 10/2006 | Gui |
| 7,317,510 | B2 | 1/2008 | Bontekoe et al. |
| 7,403,265 | B2 | 7/2008 | Tinnemans et al. |
| 7,969,636 | B2 | 6/2011 | Naito |
| 2002/0115021 | A1 | 8/2002 | Piao |
| 2002/0126479 | A1 | 9/2002 | Zhai |
| 2002/0171047 | A1 | 11/2002 | Chan |
| 2003/0043582 | A1 | 3/2003 | Chan |
| 2003/0091277 | A1 | 5/2003 | Mei |
| 2004/0124372 | A1 | 7/2004 | Gil |
| 2004/0135159 | A1 | 7/2004 | Siegel |
| 2004/0257629 | A1 | 12/2004 | Noehte |
| 2005/0167508 | A1 | 8/2005 | Syms |
| 2006/0001855 | A1 | 1/2006 | Lof |
| 2006/0103719 | A1 | 5/2006 | Katzir |
| 2006/0108508 | A1 | 5/2006 | Khalid |
| 2006/0139980 | A1 | 6/2006 | Bontekoe et al. |
| 2006/0221322 | A1 | 10/2006 | Tinnemans et al. |
| 2007/0034890 | A1 | 2/2007 | Daschner |
| 2007/0182808 | A1 | 8/2007 | Stiblert |
| 2007/0296936 | A1 | 12/2007 | Kato |
| 2008/0042969 | A1 | 2/2008 | Baker |
| 2008/0047445 | A1 | 2/2008 | Berner |
| 2008/0073588 | A1 | 3/2008 | Kruit et al. |
| 2008/0137051 | A1 | 6/2008 | Maly |
| 2008/0160211 | A1 | 7/2008 | Siegel |
| 2008/0210888 | A1 | 9/2008 | Inoue |
| 2009/0296063 | A1 | 12/2009 | Opower |
| 2010/0127431 | A1* | 5/2010 | Sandstrom .......... G06K 17/00 264/400 |
| 2010/0142757 | A1 | 6/2010 | Sandstrom |
| 2010/0142838 | A1 | 6/2010 | Ivansen et al. |
| 2010/0225974 | A1* | 9/2010 | Sandstrom ........ G03F 7/70291 358/3.26 |
| 2010/0265557 | A1 | 10/2010 | Sallander |
| 2011/0051211 | A1 | 3/2011 | Walther |
| 2011/0188016 | A1 | 8/2011 | De Jager |
| 2014/0071421 | A1 | 3/2014 | De Jager et al. |

FOREIGN PATENT DOCUMENTS

| | | |
|---|---|---|
| EP | 1 674 934 | 6/2006 |
| EP | 1 835 347 | 9/2007 |
| JP | 57-152273 | 9/1982 |
| JP | 06-275936 | 9/1994 |
| JP | 2003-220484 | 8/2003 |
| JP | 2006-186371 | 7/2006 |
| JP | 2006-285243 | 10/2006 |
| JP | 2007-517239 | 6/2007 |
| WO | 97/34171 | 9/1997 |
| WO | 98/33096 | 7/1998 |
| WO | 98/38597 | 9/1998 |
| WO | 2005/006082 | 1/2005 |
| WO | 2006/002668 | 1/2006 |
| WO | 2006/064363 | 6/2006 |
| WO | 2007/050022 | 5/2007 |
| WO | 2007/050023 | 5/2007 |
| WO | 2007/098935 | 9/2007 |
| WO | 2008/071347 | 6/2008 |
| WO | 2010/032224 | 3/2010 |
| WO | 2010/060929 | 6/2010 |
| WO | 2010/134018 | 11/2010 |
| WO | 2010/151123 | 12/2010 |
| WO | 2011/026610 | 3/2011 |
| WO | 2011/104180 | 9/2011 |

OTHER PUBLICATIONS

U.S. Appl. 61/524,190, filed Aug. 16, 2011, Pieter Willem Herman De Jager et al.
LOT-Oriel Group Europe, "MicroWriter™ Laser Lithography System," www.LOT-Oriel.com (2 pp, date unknown, obtained Jul. 2010).
"Large-Plate Exposure System FX-63S," Nikon Web Magazine: Nikon Technology Outlook, Sep. 24, 2004, pp. 1-4.
JetScreen DX Flat Brochure (6 pp., date unknown, obtained Feb. 2009).
"Lithographic Apparatus and Device Manufacturing Method," Research Disclosure, Mason Publications, Hampshire, GB, vol. 551, No. 29, Mar. 1, 2010, p. 322, XP007139689, ISSN: 0374-4353.
International Search Report mailed May 10, 2013 in corresponding International Patent Application No. PCT/EP2012/072765.
Japanese Office Action dated Jun. 23, 2015 in corresponding Japanese Patent Application No. 2014-545154.

* cited by examiner

LITHOGRAPHY APPARATUS, AN APPARATUS FOR PROVIDING SETPOINT DATA, A DEVICE MANUFACTURING METHOD, A METHOD OF CALCULATING SETPOINT DATA AND A COMPUTER PROGRAM

CROSS-REFERENCE TO RELATED APPLICATIONS

This application is the US national phase entry of PCT patent application no. PCT/EP2012/072765, filed on Nov. 15, 2012, which claims the benefit of priority of U.S. provisional application No. 61/567,485, which was filed on Dec. 6, 2011, and which is incorporated herein in its entirety by reference.

FIELD

The present invention relates to a lithographic or exposure apparatus, an apparatus to provide setpoint data, a device manufacturing method, a method of calculating setpoint data and a computer program.

BACKGROUND

A lithographic apparatus is a machine that applies a desired pattern onto a substrate or part of a substrate. A lithographic apparatus may be used, for example, in the manufacture of integrated circuits (ICs), flat panel displays and other devices or structures having fine features. In a conventional lithographic apparatus, a patterning device, which may be referred to as a mask or a reticle, may be used to generate a circuit pattern corresponding to an individual layer of the IC, flat panel display, or other device). This pattern may transferred on (part of) the substrate (e.g. silicon wafer or a glass plate), e.g. via imaging onto a layer of radiation-sensitive material (resist) provided on the substrate. In a similar regard, an exposure apparatus is a machine that use a radiation beam in forming a desired pattern on or in a substrate (or a part thereof).

Instead of a circuit pattern, the patterning device may be used to generate other patterns, for example a color filter pattern, or a matrix of dots. Instead of a conventional mask, the patterning device may comprise a patterning array that comprises an array of individually controllable elements that generate the circuit or other applicable pattern. An advantage of such a "maskless" system compared to a conventional mask-based system is that the pattern can be provided and/or changed more quickly and for less cost.

Thus, a maskless system includes a programmable patterning device (e.g., a spatial light modulator, a contrast device, etc.). The programmable patterning device is programmed (e.g., electronically or optically) to form the desired patterned beam using the array of individually controllable elements. Types of programmable patterning devices include micro-mirror arrays, liquid crystal display (LCD) arrays, grating light valve arrays, arrays of self-emissive contrast devices and the like. A programmable patterning device could also be formed from an electro-optical deflector, configured for example to move spots of radiation projected onto the substrate or to intermittently direct a radiation beam away from the substrate, for example to a radiation beam absorber. In either such arrangement, the radiation beam may be continuous.

SUMMARY

A desired device pattern to be formed on a target, such as a substrate, may be defined using a vector design package, such as GDSII. The output file from such a design package may be referred to as a vector-based representation of the desired device pattern. In a maskless system, the vector-based representation will be processed to provide a control signal to drive a programmable patterning device. The control signal may comprise a sequence of setpoints (e.g. voltages or currents) to be applied to a plurality of self-emissive contrast devices, or a micro-mirror array, for example.

The processing to convert the vector-based representation to the control signal may comprise one or more steps of converting the vector-based representation to a rasterized representation of the dose pattern. The processing may comprise one or more steps of correcting for alignment variation of the substrate, and/or of a previously formed pattern on the substrate, relative to the patterning device. The processing may comprise one or more steps of converting the rasterized representation to a sequence of setpoint values. The processing may involve complex calculations and/or large data volumes. For example, it may be necessary to perform a mapping between a rasterization grid and a spot exposure grid (defining the nominal positions at which individual radiation beams form spot exposures). The spot exposure grid may be complex and/or irregular. For steps in the processing that are carried out in real time (e.g. at the same time as the substrate is being exposed), it may be important that the calculations are completed quickly. The above aspects tend to increase the cost of the processing hardware and/or reduce the throughput of the apparatus.

It is desirable, for example, to provide a method and/or apparatus that increases the efficiency with which the datapath processing is carried out.

According to an embodiment, there is provided an exposure apparatus, comprising: a programmable patterning device configured to produce a plurality of radiation beams having individually controllable intensities; a projection system configured to project each of the radiation beams onto a respective location on a target, the plurality of radiation beams forming a desired dose pattern via a plurality of spot exposures, the nominal position of a characteristic point in the dose distribution of each of the spot exposures lying at points defining a first grid; and a controller configured to: calculate a target intensity value for each of the plurality of radiation beams to expose the target to the desired dose pattern, the calculation using as input a rasterized representation of the desired dose pattern, the rasterized representation comprising a dose value defined at each of a plurality of points on a second grid, the first and second grids having the same geometry, and control the programmable patterning device to emit beams with the target intensity values.

According to an embodiment, there is provided an apparatus to provide setpoint data to an exposure apparatus, having a programmable patterning device to produce a plurality of radiation beams having individually controllable intensities, configured to project each of the radiation beams onto a respective location on a target, the plurality of radiation beams forming a desired dose pattern via a plurality of spot exposures, the nominal positions of a characteristic point in the dose distribution of each of the spot exposures lying at points defining a first grid, the apparatus comprising: a data processing unit configured to: calculate a target intensity value for each of the plurality of radiation beams to expose the target to the desired dose pattern, the calculation using as input a rasterized representation of the desired dose pattern, the rasterized representation comprising a dose value defined at each of a plurality of points on a second grid, the first and second grids having the same geometry; and calculate a sequence of setpoint data to control the programmable patterning device to emit beams with the target intensity values.

According to an embodiment, there is provided a device manufacturing method in which a target is to be irradiated with a desired dose pattern, the method comprising: calculating an intensity value for each of a plurality of radiation beams to be used to irradiate the target, the calculation being performed by converting dose values defined at each of a plurality of points on a first grid to target intensity values of radiation beams used to generate spot exposures that are defined at each of a plurality of points on a second grid, wherein the first and second grids have the same geometry; and projecting the radiation beams having the calculated intensity values to form the spot exposures using the projection system.

According to an embodiment, there is provided a method of calculating setpoint data for an exposure apparatus, having a programmable patterning device that is configured to produce a plurality of radiation beams having individually controllable intensities, configured to project each of the radiation beams onto a respective location on a target, the plurality of radiation beams forming a desired dose pattern via a plurality of spot exposures, the nominal positions of a characteristic point in the dose distribution of each of the spot exposures lying at points defining a first grid, the method comprising: calculating a target intensity value for each of the plurality of radiation beams to expose the target to the desired dose pattern, the calculation using as input a rasterized representation of the desired dose pattern, the rasterized representation comprising a dose value defined at each of a plurality of points on a second grid, the first and second grids having the same geometry; and calculating a sequence of setpoint data to control the programmable patterning device to emit beams with the target intensity values.

According to an embodiment, there is provided a computer program to calculate setpoint data for an exposure apparatus, having a programmable patterning device to produce a plurality of radiation beams having individually controllable intensities, configured to project each of the radiation beams onto a respective location on a target, the plurality of radiation beams forming a desired dose pattern via a plurality of spot exposures, the nominal positions of a characteristic point in the dose distribution of each of the spot exposures lying at points defining a first grid, the computer program comprising code that instructs a processor to perform: calculating a target intensity value for each of the plurality of radiation beams to expose the target to the desired dose pattern, the calculation using as input a rasterized representation of the desired dose pattern, the rasterized representation comprising a dose value defined at each of a plurality of points on a second grid, the first and second grids having the same geometry; and calculating a sequence of setpoint data to control the programmable patterning device to emit beams with the target intensity values.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

An embodiment of the present invention relates to an apparatus that may include a programmable patterning device that may, for example, be comprised of an array or arrays of self-emissive contrast devices. Further information regarding such an apparatus may be found in PCT patent application publication no. WO 2010/032224 A2, U.S. patent application publication no. US 2011-0188016, U.S. patent application No. 61/473,636 and U.S. patent application No. 61/524,190 which are hereby incorporated by reference in their entireties. An embodiment of the present invention, however, may be used with any form of programmable patterning device including, for example, those discussed above.

Figure 1:
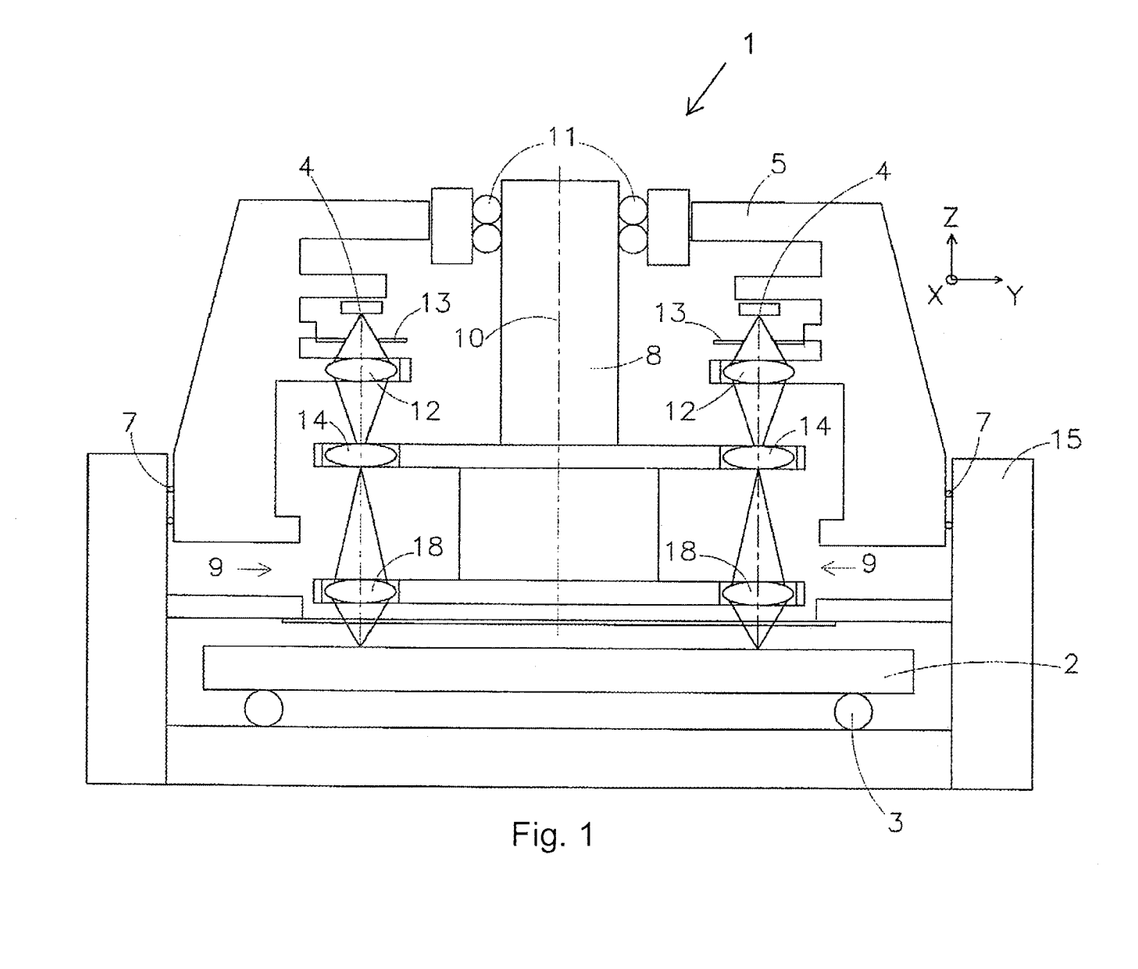
FIG. 1 depicts a part of a lithographic or exposure apparatus according to an embodiment of the invention.

FIG. 1 schematically depicts a schematic cross-sectional side view of a part of a lithographic or exposure apparatus. In this embodiment, the apparatus has individually controllable elements substantially stationary in the X-Y plane as discussed further below although it need not be the case. The apparatus 1 comprises a substrate table 2 to hold a substrate, and a positioning device 3 to move the substrate table 2 in up to 6 degrees of freedom. The substrate may be a resist-coated substrate. In an embodiment, the substrate is a wafer. In an embodiment, the substrate is a polygonal (e.g. rectangular) substrate. In an embodiment, the substrate is a glass plate. In an embodiment, the substrate is a plastic substrate. In an embodiment, the substrate is a foil. In an embodiment, the apparatus is suitable for roll-to-roll manufacturing.

The apparatus 1 further comprises a plurality of individually controllable self-emissive contrast devices 4 configured to emit a plurality of beams. In an embodiment, the self-emissive contrast device 4 is a radiation emitting diode, such as a light emitting diode (LED), an organic LED (OLED), a polymer LED (PLED), or a laser diode (e.g., a solid state laser diode). In an embodiment, each of the individually controllable elements 4 is a blue-violet laser diode (e.g., Sanyo model no. DL-3146-151). Such diodes may be supplied by companies such as Sanyo, Nichia, Osram, and Nitride. In an embodiment, the diode emits UV radiation, e.g., having a wavelength of about 365 nm or about 405 nm. In an embodiment, the diode can provide an output power selected from the range of 0.5-200 mW. In an embodiment, the size of laser diode (naked die) is selected from the range of 100-800 micrometers. In an embodiment, the laser diode has an emission area selected from the range of 0.5-5 micrometers$^2$. In an embodiment, the laser diode has a divergence angle selected from the range of 5-44 degrees. In an embodiment, the diodes have a configuration (e.g., emission area, divergence angle, output power, etc.) to provide a total brightness more than or equal to about $6.4 \times 10^8$ W/(m$^2$·sr).

Figure 2:
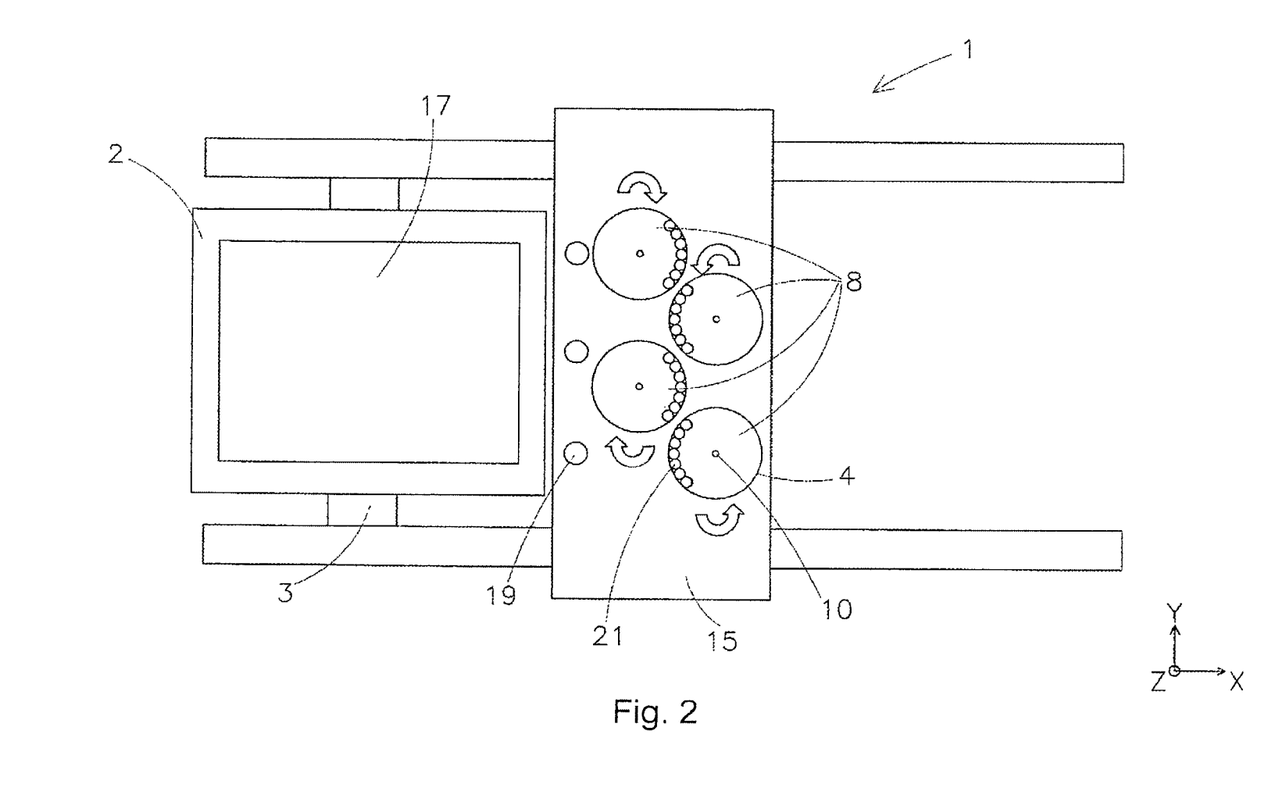
FIG. 2 depicts a top view of a part of the lithographic or exposure apparatus of FIG. 1 according to an embodiment of the invention.

The self-emissive contrast devices 4 are arranged on a frame 5 and may extend along the Y-direction and/or the X direction. While one frame 5 is shown, the apparatus may have a plurality of frames 5 as shown in FIG. 2. Further arranged on the frame 5 is lens 12. Frame 5 and thus self-emissive contrast device 4 and lens 12 are substantially stationary in the X-Y plane. Frame 5, self-emissive contrast device 4 and lens 12 may be moved in the Z-direction by actuator 7. Alternatively or additionally, lens 12 may be moved in the Z-direction by an actuator related to this particular lens. Optionally, each lens 12 may be provided with an actuator.

The self-emissive contrast device 4 may be configured to emit a beam and the projection system 12, 14 and 18 may be configured to project the beam onto a target portion of the substrate. The self-emissive contrast device 4 and the projection system form an optical column. The apparatus 1 may comprise an actuator (e.g. motor) 11 to move the optical column or a part thereof with respect to the substrate. Frame 8 with arranged thereon field lens 14 and imaging lens 18 may be rotatable with the actuator. A combination of field lens 14 and imaging lens 18 forms movable optics 9. In use, the frame 8 rotates about its own axis 10, for example, in the directions shown by the arrows in FIG. 2. The frame 8 is rotated about the axis 10 using an actuator (e.g. motor) 11. Further, the frame 8 may be moved in a Z direction by motor 7 so that the movable optics 9 may be displaced relative to the substrate table 2.

An aperture structure 13 having an aperture therein may be located above lens 12 between the lens 12 and the self-emissive contrast device 4. The aperture structure 13 can limit diffraction effects of the lens 12, the associated self-emissive contrast device 4, and/or of an adjacent lens 12/self-emissive contrast device 4.

The depicted apparatus may be used by rotating the frame 8 and simultaneously moving the substrate on the substrate table 2 underneath the optical column. The self-emisive contrast device 4 can emit a beam through the lenses 12, 14, and 18 when the lenses are substantially aligned with each other. By moving the lenses 14 and 18, the image of the beam on the substrate is scanned over a portion of the substrate. By simultaneously moving the substrate on the substrate table 2 underneath the optical column, the portion of the substrate which is subjected to an image of the self-emissive contrast device 4 is also moving. By switching the self-emissive contrast device 4 "on" and "off" (e.g., having no output or output below a threshold when it is "off" and having an output above a threshold when it is "on") at high speed under control of a controller, controlling the rotation of the optical column or part thereof, controlling the intensity of the self-emissive contrast device 4, and controlling the speed of the substrate, a desired pattern can be imaged in the resist layer on the substrate.

FIG. 2 depicts a schematic top view of the apparatus of FIG. 1 having self-emissive contrast devices 4. Like the apparatus 1 shown in FIG. 1, the apparatus 1 comprises a substrate table 2 to hold a substrate 17, a positioning device 3 to move the substrate table 2 in up to 6 degrees of freedom, an alignment/level sensor 19 to determine alignment between the self-emissive contrast device 4 and the substrate 17, and to determine whether the substrate 17 is at level with respect to the projection of the self-emissive contrast device 4. As depicted the substrate 17 has a rectangular shape, however also or alternatively round substrates may be processed.

The self-emissive contrast device 4 is arranged on a frame 15. The self-emissive contrast device 4 may be a radiation emitting diode, e.g., a laser diode, for instance a blue-violet laser diode. As shown in FIG. 2, the self-emissive contrast devices 4 may be arranged into an array 21 extending in the X-Y plane.

The array 21 may be an elongate line. In an embodiment, the array 21 may be a single dimensional array of self-emissive contrast devices 4. In an embodiment, the array 21 may be a two dimensional array of self-emissive contrast device 4.

A rotating frame 8 may be provided which may be rotating in a direction depicted by the arrow. The rotating frame may be provided with lenses 14, 18 (show in FIG. 1) to provide an image of each of the self-emissive contrast devices 4. The apparatus may be provided with an actuator to rotate the optical column comprising the frame 8 and the lenses 14, 18 with respect to the substrate.

Figure 3:
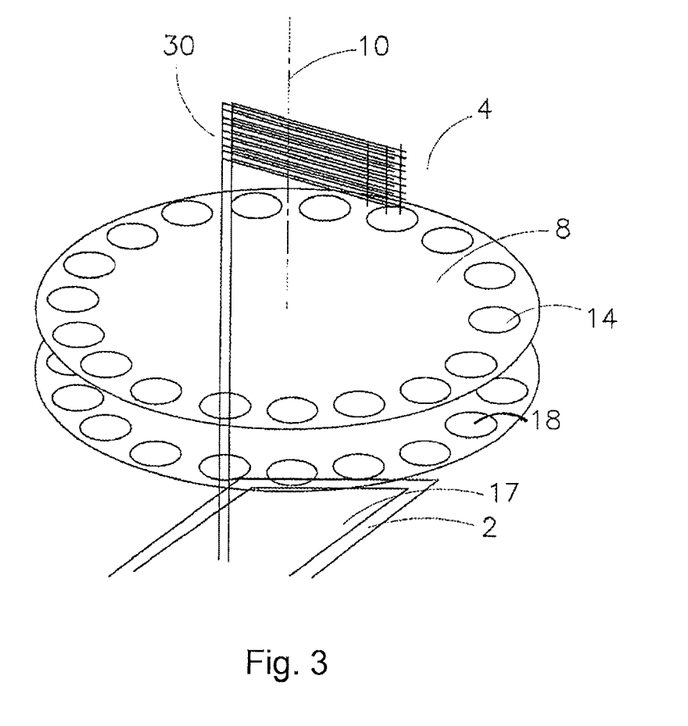
FIG. 3 depicts a highly schematic, perspective view of a part of a lithographic or exposure apparatus according to an embodiment of the invention.

FIG. 3 depicts a highly schematic, perspective view of the rotating frame 8 provided with lenses 14, 18 at its perimeter. A plurality of beams, in this example 10 beams, are incident onto one of the lenses and projected onto a target portion of the substrate 17 held by the substrate table 2. In an embodiment, the plurality of beams are arranged in a straight line. The rotatable frame is rotatable about axis 10 by means of an actuator (not shown). As a result of the rotation of the rotatable frame 8, the beams will be incident on successive lenses 14, 18 (field lens 14 and imaging lens 18) and will, incident on each successive lens, be deflected thereby so as to travel along a part of the surface of the substrate 17, as will be explained in more detail with reference to FIG. 4. In an embodiment, each beam is generated by a respective source, i.e. a self-emissive contrast device, e.g. a laser diode (not shown in FIG. 3). In the arrangement depicted in FIG. 3, the beams are deflected and brought together by a segmented mirror 30 in order to reduce a distance between the beams, to thereby enable a larger number of beams to be projected through the same lens and to achieve resolution requirements to be discussed below.

Figure 4:
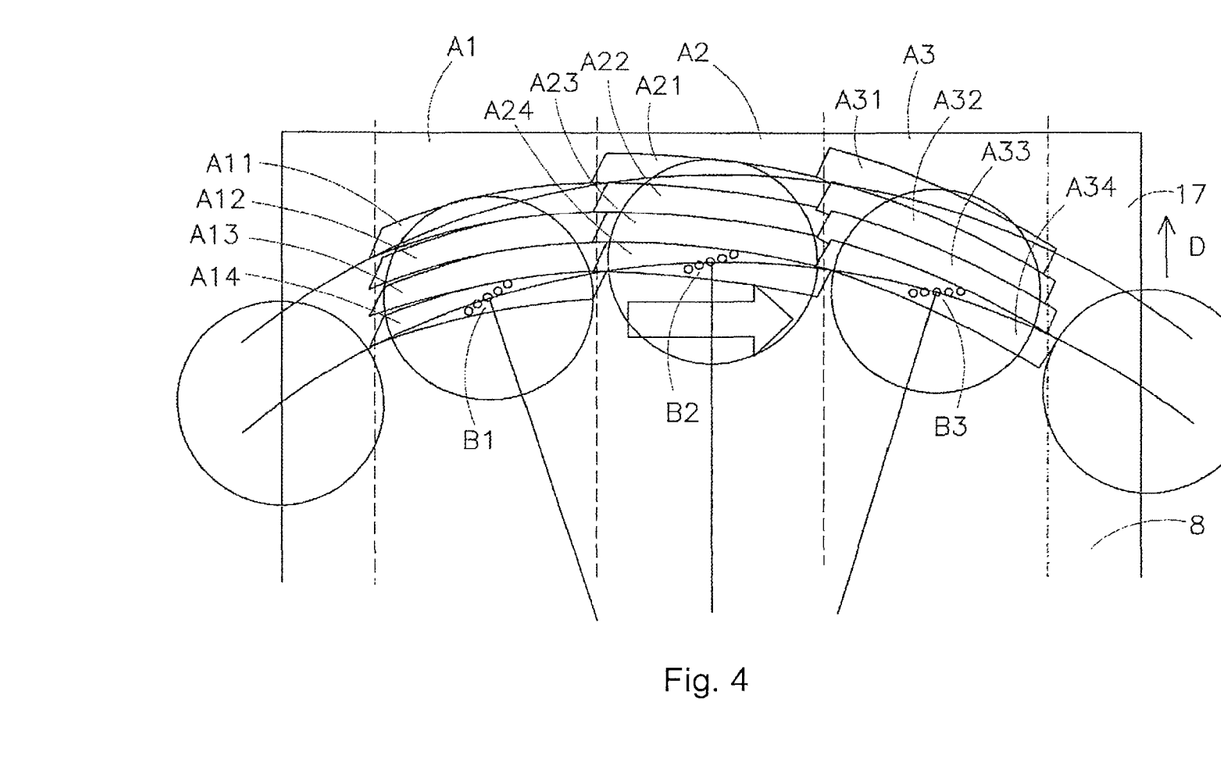
FIG. 4 depicts a schematic top view of projections by the lithographic or exposure apparatus according to FIG. 3 onto a substrate according to an embodiment of the invention.

As the rotatable frame rotates, the beams are incident on successive lenses and, each time a lens is irradiated by the beams, the places where the beam is incident on a surface of the lens, moves. Since the beams are projected on the substrate differently (with e.g. a different deflection) depending on the place of incidence of the beams on the lens, the beams (when reaching the substrate) will make a scanning movement with each passage of a following lens. This principle is further explained with reference to FIG. 4. FIG. 4 depicts a highly schematic top view of a part of the rotatable frame 8. A first set of beams is denoted by B1, a second set of beams is denoted by B2 and a third set of beams is denoted by B3. Each set of beams is projected through a respective lens set 14, 18 of the rotatable frame 8. As the rotatable frame 8 rotates, the beams B1 are projected onto the substrate 17 in a scanning movement, thereby scanning area A14. Similarly, beams B2 scan area A24 and beams B3 scan area A34. At the same time of the rotation of the rotatable frame 8 by a corresponding actuator, the substrate 17 and substrate table are moved in the direction D, which may be along the X axis as depicted in FIG. 2), thereby being substantially perpendicular to the scanning direction of the beams in the area's A14, A24, A34. As a result of the movement in direction D by a second actuator (e.g. a movement of the substrate table by a corresponding substrate table motor), successive scans of the beams when being projected by successive lenses of the rotatable frame 8, are projected so as to substantially abut each other, resulting in substantially abutting areas A11, A12, A13, A14 (areas A11, A12, A13 being previously scanned and A14 being currently scanned as shown in FIG. 4) for each successive scan of beams B1, areas A21, A22, A23 and A24 (areas A21, A22, A23 being previously scanned and A24 being currently scanned as shown in FIG. 4) for beams B2 and areas A31, A32, A33 and A34 (areas A31, A32, A33 being previously scanned and A34 being currently scanned as shown in FIG. 4) for beams B3. Thereby, the areas A1, A2 and A3 of the substrate surface may be covered with a movement of the substrate in the direction D while rotating the rotatable frame 8. The projecting of multiple beams through a same lens allows processing of a whole substrate in a shorter timeframe (at a same rotating speed of the rotatable frame 8), since for each passing of a lens, a plurality of beams scan the substrate with each lens, thereby allowing increased displacement in the direction D for successive scans. Viewed differently, for a given processing time, the rotating speed of the rotatable frame may be reduced when multiple beams are projected onto the substrate via a same lens, thereby possibly reducing effects such as deformation of the rotatable frame, wear, vibrations, turbulence, etc. due to high rotating speed. In an embodiment, the plurality of beams are arranged at an angle to the tangent of the rotation of the lenses 14, 18 as shown in FIG. 4. In an embodiment, the plurality of beams are arranged such that each beam overlaps or abuts a scanning path of an adjacent beam.

A further effect of the aspect that multiple beams are projected at a time by the same lens, may be found in relaxation of tolerances. Due to tolerances of the lenses (positioning, optical projection, etc), positions of successive areas A11, A12, A13, A14 (and/or of areas A21, A22, A23 and A24 and/or of areas A31, A32, A33 and A34) may show some degree of positioning inaccuracy in respect of each other. Therefore, some degree of overlap between successive areas A11, A12, A13, A14 may be required. In case of for example 10% of one beam as overlap, a processing speed would thereby be reduced by a same factor of 10% in case of a single beam at a time through a same lens. In a situation where there are 5 or more beams projected through a same lens at a time, the same overlap of 10% (similarly referring to one beam example above) would be provided for every 5 or more projected lines, hence reducing a total overlap by a factor of approximately 5 or more to 2% or less, thereby having a significantly lower effect on overall processing speed. Similarly, projecting at least 10 beams may reduce a total overlap by approximately a factor of 10. Thus, effects of tolerances on processing time of a substrate may be reduced by the feature that multiple beams are projected at a time by the same lens. In addition or alternatively, more overlap (hence a larger tolerance band) may be allowed, as the effects thereof on processing are low given that multiple beams are projected at a time by the same lens.

Alternatively or in addition to projecting multiple beams via a same lens at a time, interlacing techniques could be used, which however may require a comparably more stringent matching between the lenses. Thus, the at least two beams projected onto the substrate at a time via the same one of the lenses have a mutual spacing, and the apparatus may be arranged to operate the second actuator so as to move the substrate with respect to the optical column to have a following projection of the beam to be projected in the spacing.

In order to reduce a distance between successive beams in a group in the direction D (thereby e.g. achieving a higher resolution in the direction D), the beams may be arranged diagonally in respect of each other, in respect of the direction D. The spacing may be further reduced by providing a segmented mirror 30 in the optical path, each segment to reflect a respective one of the beams, the segments being arranged so as to reduce a spacing between the beams as reflected by the mirrors in respect of a spacing between the beams as incident on the mirrors. Such effect may also be achieved by a plurality of optical fibers, each of the beams being incident on a respective one of the fibers, the fibers being arranged so as to reduce along an optical path a spacing between the beams downstream of the optical fibers in respect of a spacing between the beams upstream of the optical fibers.

Further, such effect may be achieved using an integrated optical waveguide circuit having a plurality of inputs, each for receiving a respective one of the beams. The integrated optical waveguide circuit is arranged so as to reduce along an optical path a spacing between the beams downstream of the integrated optical waveguide circuit in respect of a spacing between the beams upstream of the integrated optical waveguide circuit.

A system may be provided for controlling the focus of an image projected onto a substrate. The arrangement may be provided to adjust the focus of the image projected by part or all of an optical column in an arrangement as discussed above.

In an embodiment the projection system projects the at least one radiation beam onto a substrate formed from a layer of material above the substrate 17 on which a device is to be formed so as to cause local deposition of droplets of the material (e.g. metal) by a laser induced material transfer.

Figure 5:
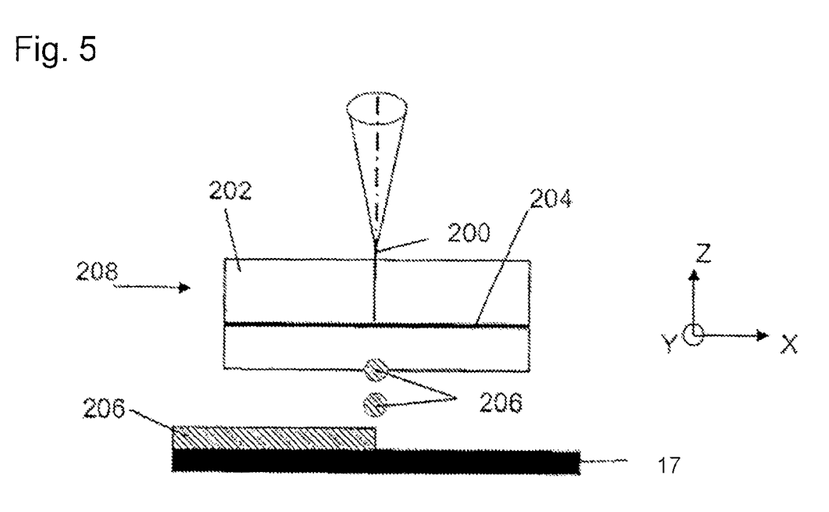
FIG. 5 depicts in cross-section, a part of an embodiment of the invention.

Referring to FIG. 5, the physical mechanism of laser induced material transfer is depicted. In an embodiment, a radiation beam 200 is focused through a substantially transparent material 202 (e.g., glass) at an intensity below the plasma breakdown of the material 202. Surface heat absorption occurs on a substrate formed from a donor material layer 204 (e.g., a metal film) overlying the material 202. The heat absorption causes melting of the donor material 204. Further, the heating causes an induced pressure gradient in a forward direction leading to forward acceleration of a donor material droplet 206 from the donor material layer 204 and thus from the donor structure (e.g., plate) 208. Thus, the donor material droplet 206 is released from the donor material layer 204 and is moved (with or without the aid of gravity) toward and onto the substrate 17 on which a device is to be formed. By pointing the beam 200 on the appropriate position on the donor plate 208, a donor material pattern can be deposited on the substrate 17. In an embodiment, the beam is focused on the donor material layer 204.

In an embodiment, one or more short pulses are used to cause the transfer of the donor material. In an embodiment, the pulses may be a few picoseconds or femto-seconds long to obtain quasi one dimensional forward heat and mass transfer of molten material. Such short pulses facilitate little to no lateral heat flow in the material layer 204 and thus little or no thermal load on the donor structure 208. The short pulses enable rapid melting and forward acceleration of the material (e.g., vaporized material, such as metal, would lose its forward directionality leading to a splattering deposition). The short pulses enable heating of the material to just above the heating temperature but below the vaporization temperature. For example, for aluminum, a temperature of about 900 to 1000 degrees Celsius is desirable.

In an embodiment, through the use of a laser pulse, an amount of material (e.g., metal) is transferred from the donor structure 208 to the substrate 17 in the form of 100-1000 nm droplets. In an embodiment, the donor material comprises or consists essentially of a metal. In an embodiment, the metal is aluminum. In an embodiment, the material layer 204 is in the form a film. In an embodiment, the film is attached to another body or layer. As discussed above, the body or layer may be a glass.

Figure 6:
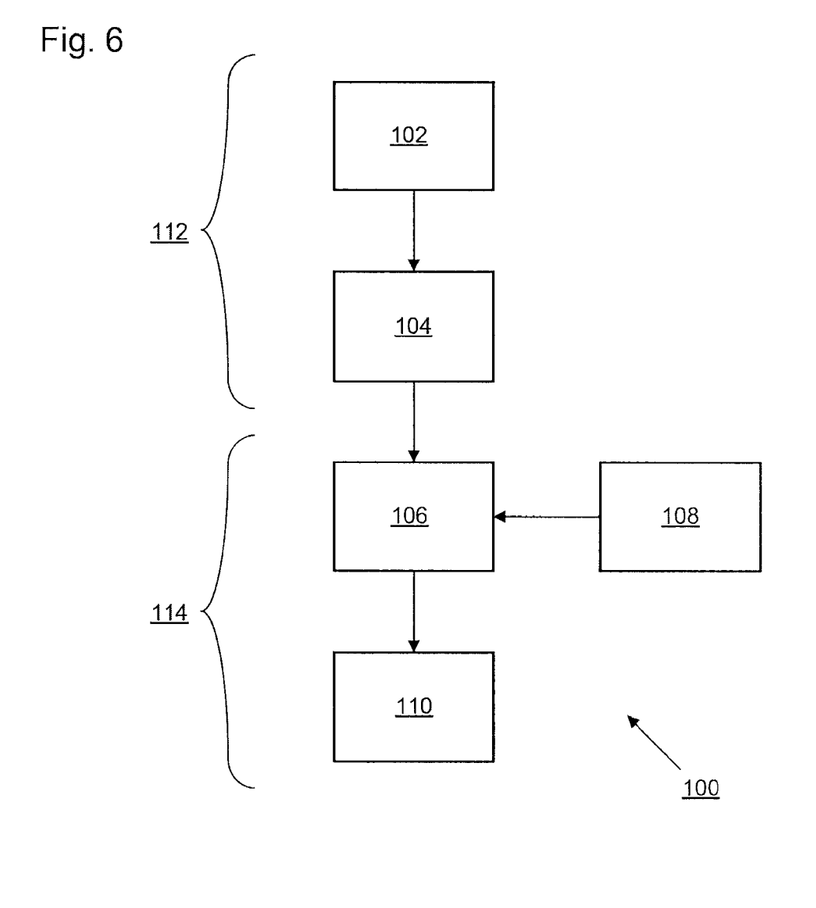
FIG. 6 depicts a portion of a data-path to convert a vector-based representation of a desired device pattern to a control signal.

Hardware and/or software constituting a data processing system 100, which may also be referred to as a "data-path", may be provided to convert a vector-based representation of a desired device pattern to be formed on a substrate to a control signal suitable to drive a programmable patterning device in such a way that a dose pattern of radiation that is suitable to form the desired device pattern is applied to a target (e.g., the substrate). FIG. 6 is a schematic illustration showing example processing stages that are included in such a data-path according to an embodiment. In an embodiment, each of the stages is connected directly to its neighboring stage. However, this need not be the case. In an embodiment, one or more additional processing stages are provided in between any of the stages shown. Additionally or alternatively, each of one or more of the stages comprises multiple stages. In an embodiment, the stages are implemented using a single physical processing unit (e.g. a computer or hardware that can carry out computing operations) or different processing units.

In the example shown in FIG. 6 a vector-based representation of a desired device pattern is provided in storage stage 102. In an embodiment, the vector-based representation is constructed using a vector design package, such as GDSII. The vector-based representation is forwarded to a rasterization stage 104, either directly or via an intermediate stage, from the storage stage 102. Examples of an intermediate stage include a vector pre-processing stage and/or a low-pass filter stage. In an embodiment, the low-pass filter stage performs anti-aliasing processing for example.

The rasterization stage 104 converts the vector-based representation (or a processed version of the vector-based representation) of the desired device pattern to a rasterized representation of a desired dose pattern that corresponds to the desired device pattern (e.g. is suitable to form the desired device pattern by, e.g., post-exposure processing of the substrate). In an embodiment, the rasterized representation comprises bitmap data. The bitmap data may be referred to as "pixelmap" data. In an embodiment, the bitmap data comprises a set of values indicating the desired dose (e.g., the dose per unit area) at each point on a grid of points. The grid of points may be referred to as a rasterization grid.

In an embodiment, the rasterized representation (as output from the rasterization stage 104 directly or after further processing) is supplied to a control signal generation stage 106. The control signal generation stage 106 is implemented as a single stage (as shown) or as a plurality of separate stages.

In an embodiment, the control signal generation stage 106 performs a mapping operation between the rasterization grid and the grid (which may be referred to as the "spot exposure grid") defining the "positions" at which the patterning device can form spot exposures at target (e.g., substrate) level. Each spot exposure comprises a dose distribution. The dose distribution specifies how the energy per unit area applied by the spot to the target (e.g., dose per unit area) varies as a function of position within the spot. The dose distribution may be referred to as a "point spread function". In an embodiment, the position of the spot exposure is defined by reference to a characteristic point in the dose distribution. In an embodiment, the characteristic point is the position of maximum dose per unit area. In an embodiment, the position of maximum dose per unit area is in a central region of the spot. In an embodiment, the position of maximum dose per unit area is not in a central region of the spot. In an embodiment, the dose distribution is circularly symmetric. In such an embodiment, the spot may be referred to as a circular spot. In such an embodiment, the position of maximum dose per unit area may be located at the center of the circle. In an embodiment, the dose distribution is not circular. In an embodiment, the characteristic point in the dose distribution is the "center of mass" of the dose distribution (defined by direct analogy with the center of mass of a flat object having variable density, in which, e.g., the dose per unit area of the spot exposure is the equivalent of the mass per unit area of the flat object). The "center of mass" of the dose distribution therefore represents the average location of the dose. In an embodiment, each grid point in the spot exposure grid represents the position of a different one of the spot exposures (e.g. the position of the characteristic point) that the patterning device (and/or projection system) can apply to the target.

In an embodiment, each spot exposure corresponds to a region of radiation dose on the target that originates from a single self-emissive contrast device during a single period of that contrast device being driven at a substantially constant power, for example. In an embodiment, each spot exposure corresponds to a region of radiation dose on the substrate that originates from a single mirror or group of mirrors in a micro-mirror array.

In an embodiment, the mapping operation comprises interpolation between the rasterization grid and the spot exposure grid. In an embodiment, the mapping operation is configured to receive metrology data from a metrology data storage stage 108. In an embodiment, the metrology data specifies a position and/or orientation of a mounted substrate, and/or of a previously formed device pattern on the mounted substrate, relative to the patterning device. In an embodiment, the metrology data also specifies measured distortion of a mounted substrate or a previously formed device pattern. In an embodiment, the distortion includes one or more of the following: shift, rotation, skew and/or magnification. The metrology data therefore provides information about how the interpolation/mapping between the rasterization grid and the spot exposure grid should be carried out in order to ensure proper positioning of the desired dose pattern on the target.

In an embodiment, the control signal generation stage 106 calculates a set of values representing target intensities for the radiation beams that form each of the spot exposures. The target intensities thus determine the total dose (or energy) that will be associated with a given spot exposure. The intensities are converted to setpoint values. In an embodiment, each spot exposure is produced by applying a driving signal (e.g. a voltage or current) to a radiation source, such as a self-emissive contrast device, for a certain time. In an embodiment, the setpoint value defines the signal level to apply. In an embodiment, the signal level determines the power output of a radiation source, such as a self-emissive contrast device. In an embodiment in which the patterning device comprises a micro-mirror array, the setpoint values define actuation states of the mirrors in the micro-mirror array. In an embodiment in which the micro-mirror array is a grayscale digital micro-mirror device (DMD), the setpoint values define the grayscale levels to be applied by the mirrors. In an embodiment, the grayscale levels are defined by controlling a process of high-speed switching of individual mirrors between at least two different tilt positions. In an embodiment in which the micromirror array comprises mirrors that are each selectively actuatable to one of a plurality of different tilt angles, the setpoint values define the tilt angles to be applied to the mirrors.

In an embodiment, the calculation of the set of intensity values accounts for the properties of the optical projection system and may therefore be referred to as an "inverse-optics" calculation. In an embodiment, the calculation accounts for the size and/or shape of individual spots. In an embodiment, the size and/or shape of individual spots are at least partially dictated by one or more properties of the optical projection system. In an embodiment, the size and/or shape is defined for each of a given set of possible applied intensities for the spot. The spot size and/or shape is defined, as described above, by the dose distribution or point spread function of the spot. In an embodiment, the calculation also takes into account deviation in the position of the spot from a nominal position defined by the ideal (i.e. engineering-error free and/or manufacturing-error free) spot exposure grid geometry.

In an embodiment the spots overlap with each other at target level (i.e. the dose distribution of one or more spots extend so as to overlap with the dose distribution of one or more other spots) so that the final dose per unit area achieved at a reference position in the spot exposure grid depends on the applied intensities at a number of neighboring spots. This effect can be described (handled/modeled) mathematically by a convolution (or deconvolution) operation. In an embodiment the control signal generation stage 106 performs the reverse process to determine the intensities to be applied at each position for a given desired dose pattern (i.e. the target intensity value for each of the plurality of radiation beams that form the plurality of spot exposures). Therefore, in such an embodiment the control signal generation stage 106 performs a deconvolution (or convolution) operation. This operation is referred to below as a (de-)convolution operation to reflect the fact that it can be described equivalently as a convolution operation and as a deconvolution operation. In an embodiment the (de-)convolution operation is defined by a (de-)convolution kernel. In an embodiment the (de-)convolution kernel is represented by a (de-)convolution matrix. In an embodiment the coefficients of such a (de-)convolution matrix are interpreted as weights that define the extent to which the dose per unit area at points in the region of a reference point in the desired dose pattern is to be taken into account when calculating the intensity value for forming a spot exposure at the corresponding point in the spot exposure grid.

Figure 7:
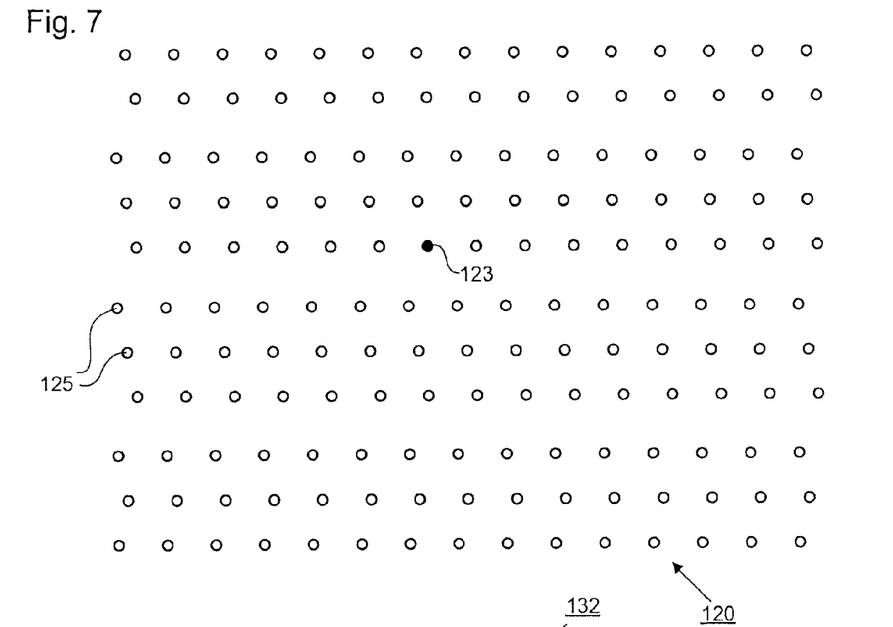
FIG. 7 depicts a portion of a spot exposure grid.
Figure 8:
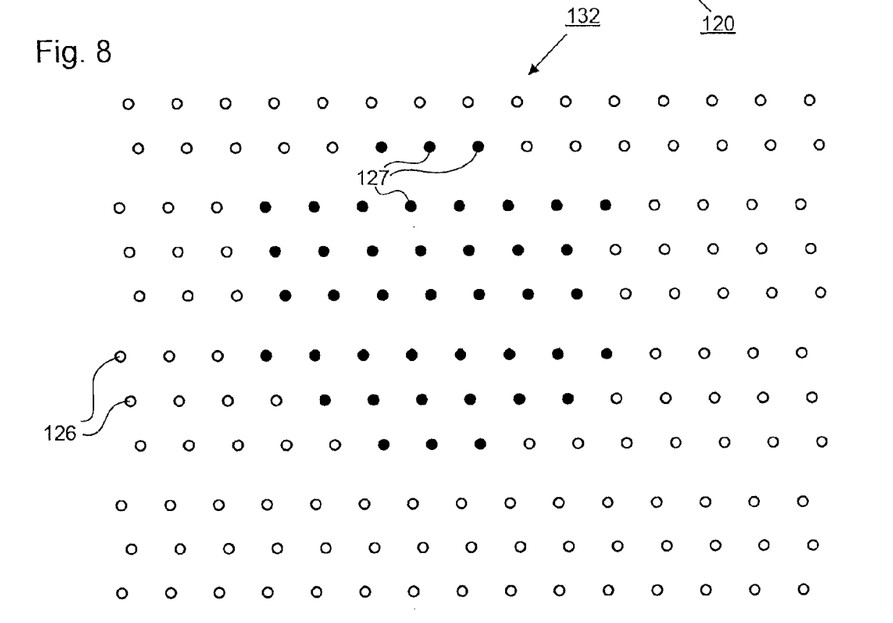
FIG. 8 depicts a portion of a rasterization grid having a geometry matched to the geometry of the spot exposure grid of FIG. 7.

FIGS. 7 and 8 illustrate highly schematically a step in such a (de-)convolution operation.

FIG. 7 illustrates a portion of a highly schematic example spot exposure grid 120. Each point 125 in the grid 120 represents the nominal position of a spot on the substrate (e.g. the position of the characteristic point in the dose distribution of the spot) that will be formed by one of the plurality of beams controlled by the patterning device. The (de-)convolution operation aims to determine the intensity value of the radiation beam forming the spot exposure at each of the points 125. The spot exposure grid 120 has a geometry that corresponds to the pattern of spot exposures that the patterning device is able to form on the target. In an embodiment, the geometry of the spot exposure grid is irregular. In an irregular grid, within the meaning of the present application, the density of grid points varies as a function of position so that it is not possible to construct the grid completely by tessellating a single unit cell that contains a single grid point only. FIG. 7 illustrates the geometry of an irregular grid in a highly schematic manner. The geometry of the grid 120 depicted does not necessarily resemble a spot exposure grid associated with a commercial device, which may be considerably more complex.

FIG. 8 illustrates an example portion of a rasterization grid 132 that has the same geometry as the spot exposure grid shown in FIG. 7. Here, the grid points 126 are arranged irregularly. The solid grid points 127 represent schematically the grid points that could be involved with a (de-)convolution operation for determining the target intensity value for forming the spot exposure at position 123 (chosen at random) in the grid of FIG. 7. Application of the (de-)convolution operation to derive the intensity value to form the spot exposure at solid grid point 123 will involve weighted contributions of the samples of the desired dose pattern ("dose values") at a plurality of grid points in the rasterization grid in the region of the rasterization grid corresponding to the position of the reference grid point 123. In an embodiment, a (de-)convolution kernel expressed as a matrix will define which grid points 126 are involved (by the positions of the non-zero coefficients in the matrix) and the extent to which the grid points are involved (by the values of the non-zero coefficients in the matrix).

In an embodiment, the nature of the (de-)convolution operation is different for different points (or even in between different points) in the spot exposure grid. In an embodiment, such variation takes into account variations in the optical performance of the patterning device for example. In an embodiment the variations in optical performance are obtained using calibration measurements. In an embodiment a library of (de-)convolution kernels, optionally obtained from calibration measurements, is stored and accessed as needed.

The (de-)convolution calculations are computationally expensive due to the complex geometry of the spot exposure grid. The spot exposure grid will be particularly complex in embodiments in which the patterning device projects radiation beams via a projection system comprising a stationary part and a moving part (e.g. parts that rotate, such as frame 8). The geometry of the spot exposure grid is fixed by the way in which the spot exposures are formed by the patterning device and the projection system and cannot easily be changed. However, it is possible to make the geometry of the rasterization grid of the data input to the (de-)convolution calculations the same as the spot exposure grid (same geometry type and/or size and/or orientation). FIG. 8 is a schematic illustration of such a grid. It might be thought that the (de-)convolution operation would become more difficult (relative to the case where the input data is defined relative to a regular grid for example) if the grid of the input data is made more complex in this way. However, a disadvantage associated with the irregular geometry of the input grid is more than compensated for by the fact that the geometry of the input grid to the (de-)convolution calculations now matches the geometry of the output grid from the (de-)convolution calculations (i.e. the spot exposure grid).

In an embodiment, the rasterization stage 104 is configured initially to convert the vector-based representation (or a processed version of the vector-based representation) to a rasterized representation that is defined relative to a regular rasterization grid. In an embodiment the regular rasterization grid may have a rectangular geometry for example. The density of grid points of a regular grid, within the meaning of the present application, is "uniform" in the sense that the grid can be completely formed by tessellating a single type of unit cell that comprises a single grid point only. An interpolation/mapping processing is then used in a subsequent step to convert the rasterized representation that is defined relative to the regular rasterization grid to a rasterized representation that is defined relative to an irregular rasterization grid. In an embodiment, the irregular rasterization grid matches the geometry of the spot exposure grid. In an embodiment, the interpolation/mapping processing is carried out by the control signal generation stage 106 or a portion of the control signal generation stage 106 and takes into account metrology data received from the metrology data storage stage 108. In an embodiment, the interpolation/mapping processing is carried out by the rasterization stage 104. In such an embodiment the rasterization stage 104 or a portion of the rasterization stage 104 is configured to communicate with the metrology data storage stage 108.

In an embodiment, the interpolation/mapping processing (to convert between a rasterized representation defined relative to a regular grid and a rasterized representation defined relative to an irregular grid for input to the (de-)convolution calculations) takes into account the position and/or orientation of a mounted substrate, and/or of a previously formed device pattern on the mounted substrate, relative to the patterned device, as indicated in the metrology data. In an embodiment, the interpolation/mapping processing takes into account a distortion that includes one or more of the following, as indicated in the metrology data: shift, rotation, skew, magnification and/or a higher order distortion (such as pincushion distortion). In such an embodiment, the interpolation/mapping is therefore carried out in such a way as to ensure proper positioning of the desired dose pattern on the substrate.

In an embodiment, the geometries of the rasterization grid used for the rasterized representation that is input to the (de-)convolution calculations and the spot exposure grid are matched so that if the rasterization grid were laid over the top of the spot exposure grid, a majority or all of the grid points in the rasterization grid would be aligned with corresponding grid points of the spot exposure grid and/or a majority or all of the grid points in the spot exposure grid would be aligned with corresponding grid points of the rasterization grid.

In an embodiment, the rasterization stage 104 is configured to convert the vector-based representation (or a processed version of the vector-based representation) directly to a rasterized representation that is defined relative to an irregular rasterization grid (e.g. without the intermediate step of producing rasterized data that is defined relative to a regular grid). In an embodiment, this irregular rasterization grid matches the spot exposure grid. In an embodiment, such a direct conversion process comprises a coordinate transformation, in the vector domain, applied to all polygon vertices. In an embodiment, the coordinate transformation takes into account the relative alignment and/or relative orientation and/or any distortion (e.g. shift, rotation, skew, magnification and/or higher order distortion) of a mounted substrate, and/or a previously formed pattern on the mounted substrate. In an embodiment the coordinate transformation uses metrology data input from the metrology data storage stage 108.

In an embodiment, matching of the geometries of the rasterization and spot exposure grids enables the (de-)convolution kernel matrix (which is defined at discrete points corresponding to the coefficients of the matrix) to sample the (de-)convolution operator (a continuous function) more efficiently. In particular, the matching of the grids will tend to cause maxima and minima in the (de-)convolution operator to fall at grid points in the rasterization grid and thereby be sampled efficiently by the coefficients of the (de-)convolution kernel matrix. In an embodiment, the resulting (de-)convolution kernel matrix is more sparse than the equivalent (de-)convolution kernel matrix defined relative to a rasterization grid having a geometry (e.g. a regular geometry) that is different to the geometry of the spot exposure grid. In an embodiment, the (de-)convolution kernels can be defined using fewer coefficients.

In an embodiment, (de-)convolution kernels are calculated offline and stored as reference (de-)convolution kernels. In an embodiment, the reference (de-)convolution kernels each represent an expected dose distribution (or point spread function) associated with a spot exposure having a position (e.g. the position of the characteristic point in the dose distribution of the spot) located at a given point in the spot exposure grid. In an embodiment, the reference (de-)convolution kernels are obtained from calibration measurement. In an embodiment, the reference (de-)convolution kernels are defined at a subset of points (i.e. fewer than all possible points) in the spot exposure grid (or in between points in the spot exposure grid). In an embodiment, interpolation and/or approximation between/using the stored reference (de-)convolution kernels is used to derive (de-)convolution kernels for use at a position where reference data is not available. The reference (de-)convolution kernels are thereby used not only at the point in the spot exposure grid at which they are defined but at one or more neighboring points (optionally in combination with other (de-)convolution kernels defined at points nearby). In an embodiment, a given kernel is used to calculate the intensity values for a plurality of consecutive pulses of a given contrast device (optionally in combination with other kernels). This approach reduces the number of (de-)convolution kernels to be derived and/or stored as reference (de-)convolution kernels. Matching the geometries of the rasterization and spot exposure grids improves the efficiency with which (de-)convolution kernels can be reused in this way. In particular, the interpolation operations to derive (de-)convolution kernels from nearby reference (de-)convolution kernels can be carried out more efficiently, using fewer mathematical steps.

In an embodiment, the control signal generation stage 106 converts the sequence of target intensity values for the radiation beams to setpoint values in order to generate the control signal. In an embodiment, the setpoint values take into account the nature of the patterning device. For example, where the patterning device comprises a plurality of self-emissive contrast devices, the setpoint values in such an embodiment account for non-linearity in the response of the self-emissive contrast devices (e.g. non-linearity in the variation of output power as a function of applied setpoint/voltage/current). In an embodiment the setpoint values take into account variation in one or more properties of nominally identical contrast devices, by calibration measurement for example. In an embodiment in which the patterning device comprises a micro-mirror array, the setpoint values take into account the response of the mirrors (e.g. the relationship between the applied setpoint value(s) for a given mirror or group of mirrors and the intensity of the associated radiation beam(s)).

A control signal output stage 110 receives the control signal from the control signal generation stage and supplies the signal to the patterning device. The control signal generation stage 106 and control signal output stage 110 may be referred to as a "controller" to control a programmable patterning device of the exposure apparatus to emit beams with target intensity values necessary to produce a desired dose pattern on a target.

In the example shown in FIG. 6, stages 102 and 104 operate in an offline part 112 of the data-path and stages 106-110 operate in an online (i.e. realtime) part 114 of the data-path. However, in an embodiment, all or a portion of the functionality associated with stage 104 is carried out online. Alternatively or additionally, all or a portion of the functionality of stages 106 and/or 108 are carried out offline.

In accordance with a device manufacturing method, a device, such as a display, integrated circuit or any other item may be manufactured from the substrate on which the pattern has been provided.

Although specific reference may be made in this text to the use of a lithographic or exposure apparatus in the manufacture of ICs, it should be understood that the apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one of various types of optical components, including refractive, diffractive, reflective, magnetic, electromagnetic and electrostatic optical components or combinations thereof.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine-readable instruction may be embodied in two or more computer programs. The two or more computer programs may be stored on one or more different memories and/or data storage media.

The descriptions above are intended to be illustrative, not limiting. Thus, it will be apparent to one skilled in the art that modifications may be made to the invention as described without departing from the scope of the claims set out below.

The invention claimed is:

1. An exposure apparatus, comprising:
a programmable patterning device configured to produce a plurality of radiation beams having individually controllable intensities;
a projection system configured to project each of the radiation beams onto a respective location on a target, the plurality of radiation beams forming a desired dose pattern via a plurality of spot exposures, the nominal position of a characteristic point in the dose distribution of each of the spot exposures lying at points defining a first grid; and
a controller configured to:
calculate a target intensity value for each of the plurality of radiation beams to expose the target to the desired dose pattern, the calculation using as input a rasterized representation of the desired dose pattern, the rasterized representation comprising a dose value defined at each of a plurality of points on a second grid, the first and second grids having the same geometry, and
control the programmable patterning device to emit beams with the target intensity values.

2. The apparatus according to claim 1, wherein the controller is configured to apply a (de-)convolution operation to the rasterized representation to obtain the target intensity values.

3. The apparatus according to claim 2, wherein the (de-)convolution operation for a given spot exposure in the first grid is defined by a matrix kernel, the coefficients in the matrix kernel defining the weightings to be applied to dose values at respective points in the second grid.

4. The apparatus according to claim 1, wherein the densities of each of the first and second grids is non-uniform.

5. The apparatus according to claim 1, wherein the geometry of the first and second grids are not representable in terms of a unique unit cell comprising a single grid point.

6. The apparatus according to claim 1, wherein the calculation of the target intensity values takes into account the expected dose distribution associated within each spot exposure.

7. The apparatus according to claim 6, wherein the expected dose distribution of each spot exposure is obtained by:
reading pre-stored reference expected dose distribution data for a subset of the spot exposures; and
using interpolation and/or approximation between the reference expected dose distribution data to estimate the expected dose distribution of spot exposures other than the subset of the spot exposures.

8. The apparatus according to claim 1, wherein the controller is configured to carry out an interpolation and/or approximation and/or mapping operation to convert a rasterization representation comprising a dose value defined at each of a plurality of points on a third grid to the rasterized representation comprising a dose value defined at each of the plurality of points on the second grid, wherein the third grid is a regular grid.

9. The apparatus according to claim 8, wherein the geometry of the third grid is representable in terms of a unique unit cell comprising a single grid point.

10. The apparatus according to claim 8, wherein the interpolation and/or mapping operation takes into account measurement of the position and/or orientation of the target, and/or of a previously formed device pattern on the target.

11. The apparatus according to claim 1, wherein the controller is configured to convert a vector-based representation of a desired dose pattern to the rasterized representation comprising a dose value defined at each of a plurality of points on the second grid by applying a coordinate transformation, in the vector domain, to vertices of polygons in the vector-based representation.

12. An apparatus to provide setpoint data to an exposure apparatus, having a programmable patterning device to produce a plurality of radiation beams having individually controllable intensities, configured to project each of the radiation beams onto a respective location on a target, the plurality of radiation beams forming a desired dose pattern via a plurality of spot exposures, the nominal positions of a characteristic point in the dose distribution of each of the spot exposures lying at points defining a first grid, the apparatus comprising:

a data processing unit configured to:

calculate a target intensity value for each of the plurality of radiation beams to expose the target to the desired dose pattern, the calculation using as input a rasterized representation of the desired dose pattern, the rasterized representation comprising a dose value defined at each of a plurality of points on a second grid, the first and second grids having the same geometry; and calculate a sequence of setpoint data to control the programmable patterning device to emit beams with the target intensity values.

13. A device manufacturing method in which a target is to be irradiated with a desired dose pattern, the method comprising:

calculating an intensity value for each of a plurality of radiation beams to be used to irradiate the target, the calculation being performed by converting dose values defined at each of a plurality of points on a first grid to target intensity values of radiation beams used to generate spot exposures that are defined at each of a plurality of points on a second grid, wherein the first and second grids have the same geometry; and projecting the radiation beams having the calculated intensity values to form the spot exposures using a projection system.

14. A method of calculating setpoint data for an exposure apparatus, having a programmable patterning device that is configured to produce a plurality of radiation beams having individually controllable intensities, configured to project each of the radiation beams onto a respective location on a target, the plurality of radiation beams forming a desired dose pattern via a plurality of spot exposures, the nominal positions of a characteristic point in the dose distribution of each of the spot exposures lying at points defining a first grid, the method comprising:

calculating a target intensity value for each of the plurality of radiation beams to expose the target to the desired dose pattern, the calculation using as input a rasterized representation of the desired dose pattern, the rasterized representation comprising a dose value defined at each of a plurality of points on a second grid, the first and second grids having the same geometry; and calculating a sequence of setpoint data to control the programmable patterning device to emit beams with the target intensity values.

15. A non-transitory computer readable medium having stored therein a computer program to calculate setpoint data for an exposure apparatus, having a programmable patterning device to produce a plurality of radiation beams having individually controllable intensities, configured to project each of the radiation beams onto a respective location on a target, the plurality of radiation beams forming a desired dose pattern via a plurality of spot exposures, the nominal positions of a characteristic point in the dose distribution of each of the spot exposures lying at points defining a first grid, the computer program comprising code that instructs a processor to perform:

calculating a target intensity value for each of the plurality of radiation beams to expose the target to the desired dose pattern, the calculation using as input a rasterized representation of the desired dose pattern, the rasterized representation comprising a dose value defined at each of a plurality of points on a second grid, the first and second grids having the same geometry; and calculating a sequence of setpoint data to control the programmable patterning device to emit beams with the target intensity values.

16. The computer readable medium according to claim 15, comprising code that instructs the processor to apply a (de-)convolution operation to the rasterized representation to obtain the target intensity values.

17. The computer readable medium according to claim 15, wherein the densities of each of the first and second grids is non-uniform.

18. The computer readable medium according to claim 15, wherein the geometry of the first and second grids are not representable in terms of a unique unit cell comprising a single grid point.

19. The computer readable medium according to claim 15, wherein the calculation of the target intensity values takes into account the expected dose distribution associated within each spot exposure.

20. The computer readable medium according to claim 15, comprising code that instructs the processor to convert a rasterization representation comprising a dose value defined at each of a plurality of points on a third grid to the rasterized representation comprising a dose value defined at each of the plurality of points on the second grid, wherein the third grid is a regular grid.

* * * * *

UNITED STATES PATENT AND TRADEMARK OFFICE
CERTIFICATE OF CORRECTION

PATENT NO. : 9,488,921 B2
APPLICATION NO. : 14/356357
DATED : November 8, 2016
INVENTOR(S) : Patricius Aloysius Jacobus Tinnemans et al.

Page 1 of 1

It is certified that error appears in the above-identified patent and that said Letters Patent is hereby corrected as shown below:

On the Title Page

Item (56) References Cited - Foreign Patent Documents
before "DE   4315581   11/1994"
add --DE 4315580   11/1994--.

Signed and Sealed this
Seventh Day of March, 2017

Michelle K. Lee
*Director of the United States Patent and Trademark Office*